United States Patent [19]

Okitaka et al.

[11] Patent Number: 5,208,773
[45] Date of Patent: May 4, 1993

[54] SEMICONDUCTOR MEMORY DEVICE HAVING BIT LINES AND WORD LINES DIFFERENT IN DATA READING AND DATA WRITING

[75] Inventors: Takenori Okitaka; Yasunori Maeda; Yukio Miyazaki, all of Hyogo, Japan

[73] Assignee: Mitsubishi Denki Kabushiki Kaisha, Tokyo, Japan

[21] Appl. No.: 669,437

[22] Filed: Mar. 13, 1991

[30] Foreign Application Priority Data

Mar. 20, 1990 [JP] Japan ................... 2-70837

[51] Int. Cl.$^5$ .............................................. G11C 13/00
[52] U.S. Cl. ................................ 365/189.04; 365/190;
365/203; 365/206
[58] Field of Search ................ 365/203, 189.01, 190,
365/206, 189.04

[56] References Cited

U.S. PATENT DOCUMENTS 4,318,014 3/1982 McAlister .
4,779,228 10/1988 Uchiyama et al. .
5,083,047 1/1992 Horie et al. .................. 365/203

Primary Examiner—Terrell W. Fears
Attorney, Agent, or Firm—Lowe, Price, LeBlanc & Becker

[57] ABSTRACT

Disclosed is the serial access memory having the improved precharging system of reading bit lines (4). In this serial access memory, an address pointer (9, 114) outputs a signal for selecting one of the reading bit lines (4). Meanwhile, each reading bit line (4) is provided with an MOS transistor (7) for precharging the same. By using the output of the address pointer (9, 114) to control on/off of the MOS transistor (7), the period when each reading bit line (4) is precharged is limited within the period when the reading bit line is selected. As a result, current flowing through the reading bit lines (4) during the data reading can be reduced to achieve the reduction in power consumption of the serial access memory and the increase in the operation speed.

30 Claims, 10 Drawing Sheets ns5,208,773

SEMICONDUCTOR MEMORY DEVICE HAVING BIT LINES AND WORD LINES DIFFERENT IN DATA READING AND DATA WRITING

BACKGROUND OF THE INVENTION

1. Field of the Invention

The present invention relates generally to semiconductor memory devices and, more particularly, to a semiconductor memory device comprising two bit lines one for writing and the other for reading and two word lines one for writing and the other for reading for each memory cell, which device is represented by a serial access memory.

2. Description of the Background Art

Some semiconductor memory device includes memory cells, data of which is written and read through different paths. Such a semiconductor memory device is represented by a serial access memory.

In a serial access memory, data serially inputted bit by bit is written in a memory cell array in the order of addresses and the data is serially read bit by bit in the order of address from the memory cell array.

FIG. 10 is a schematic block diagram showing an entire arrangement of a conventional serial access memory.

Referring to FIG. 10, the serial access memory comprises a memory block 100 having memory cells arranged in matrix, a sense amplifier 102 for amplifying the data read from memory block 100, and a reading data buffer 104 for outputting the data amplified by sense amplifier 102 at an output terminal 106. The serial access memory further comprises a writing data buffer 110 for buffering the data inputted from a data input terminal 108 and applying the same to memory block 100, a writing address pointer 112 for rendering the memory cells in memory block 100 writable in the order of address during the data writing and a reading address pointer 114 for rendering the memory cells in the memory block 100 readable in the order of addresses during the data reading.

In the data writing, input data $D_0-D_n$ (n is a natural number) is applied to writing data buffer 110 through data input terminal 108. Writing data buffer 110 outputs the input data $D_0-D_n$ from data input terminal 108 bit by bit to memory block 100 in response to a writing clock signal WCK externally inputted from a writing clock terminal 116. At the same time, writing address pointer 112 renders the memory cells in memory block 100 writable in the order of address in response to the writing clock signal WCK such that each of the input data outputted from writing data buffer 110 is written in the memory cells in memory block 100 in the order of address. As a result, the input data is written row by row in the memory cells of memory block 100 in the order of address.

In the data reading, reading address pointer 114 selects the memory cells of memory block 100 in the order of address and renders the same readable in response to a reading clock signal RCK externally applied to a reading clock terminal 118 and activates sense amplifier 102. As a result, after the data is outputted from the memory cells of memory block 100 in the order of address, the data is amplified by sense amplifier 102 to a predetermined level. Then, reading data buffer 104 outputs each of data $Q_0-Q_n$ amplified by sense amplifier 102 in a predetermined cycle at data output terminal 106 in response to the reading clock signal RCK. In this way, the storage data of memory block 100 is extracted row by row in the order of address at data output terminal 106.

The specific arrangement of memory block 100 will be described. FIG. 11 is a partial circuit diagram showing the internal arrangement of memory block 100.

Referring to FIG. 11, in memory block 100, each of memory cells 1 is provided between a writing bit line 3 and a reading bit line 4 to constitute a memory cell column. At the same time, the adjacent memory cells in a row direction are connected to the same writing word line 5 and reading word line 6 to constitute a memory cell row.

Connected between each reading bit line 4 and a power supply line 19 supplied with a voltage Vcc of a logical high "H" level from a power supply (not shown) is an N channel MOS and a transistor 7 as a precharging transistor for precharging reading bit line 4 to a potential of a "H" level.

Precharging transistor 7 has a gate and a drain receiving the power supply voltage Vcc. Therefore, precharging transistor 7 is always turned on and when no data is read from memory cell 1, the transistor precharges reading bit line 4 by a voltage lower than the power supply voltage Vcc by a threshold voltage of the transistor.

Connected between each reading bit line 4 and reading address pointer 114 is an invertor 13 for inverting the potential on the reading bit line and two N channel MOS transistors 8a and 8b.

Each transistor 8a is provided between an input end of invertor 13 and sense amplifier 12, and each transistor 8b is provided between an output end of invertor 13 and sense amplifier 102. The gates of transistors 8a and 8b are connected together, which is connected to address pointer 114. Address pointer 114 has output terminals $A_0, A_1, \ldots A_n$ corresponding to the respective reading bit lines 4 and the gates of transistors 8a and 8b provided corresponding to each reading bit line 4 are connected to the output terminals $A_0-A_n$, respectively. Address pointer 114 sequentially outputs a voltage of a "H" level from the output terminals $A_0-A_n$ in response to the read clocking signal RCK to turn on the corresponding transistors 8a and 8b. Transistors 8a and 8b are reading bit line access transistors for transmitting the potential on the corresponding reading bit line and an inversed potential thereof, respectively, to sense amplifier 102 only in the on state.

Sense amplifier 102 amplifies the voltages of reading bit lines 4 provided corresponding to the transistors 8a and 8b to a predetermined level corresponding to the logical level and applies the amplified voltages to reading data buffer 104 by differentially amplifying the two voltages inputted through the transistors 8a and 8b.

Reading bit line 3 is connected to writing data buffer 110 of FIG. 10 and sequentially transmits the input data row by row to memory cell 1. Writing word line 5 is connected to writing address pointer 112 to receive, as writing word line selecting signal, potential for simultaneously rendering all the memory cells in a respective memory row data-writable. More specifically, writing address pointer 112 includes the same number (m) of output terminals $B_0-B_m$ as the number of writing word lines 5. These m writing word lines 5 are connected to output terminals $B_0-B_m$, respectively, through diode-connected N-channel MOS transistors 90. Writing address pointer 112 outputs as a writing word line selecting signal, a "H" level potential to one of m output terminals B$_0$–B$_m$. As a result, the potential of one of the m writing word lines 5 rises to a "H" level. Reading word lines 6 are sequentially driven one by one by address pointer 114. More specifically, the potential for rendering memory cell 1 data readable is applied as a reading word line selecting signal from address pointer 114 to only the reading word line 6 corresponding to the memory cell which data to be read (hereinafter referred to as the selected memory cell).

FIG. 12 is a circuit diagram showing the internal arrangement of memory cell 1.

Referring to FIG. 12, memory cell 1 comprises an N channel MOS transistor 14 having a gate connected to writing word line 5, an N channel MOS transistor 16 having a gate connected to reading word line 6, an N channel MOS transistor 15 and a memory capacitor 17. The transistors 15 and 16 are connected in series between reading bit line 4 and ground 18 and the transistor 14 is provided between writing bit line 3 and the gate of transistor 15. Memory capacitor 17 is provided between a node between the gate of transistor 15 and transistor 14 and ground 18. Reading bit line 4 is connected to a power supply line 19 through precharging transistor 7. The operation of this memory cell during data writing and data reading will be described below.

The data writing to memory cell 1 will be performed as follows.

The writing word line selecting signal causes the potential on writing word line 5 to attain a "H" level and a voltage of a "H" level or a "L" level is applied as input data to writing bit line 3. Writing word line 5 attains a "H" level to turn on transistor 14 and consequently a potential level of writing bit line 3, which is the input data, causes memory capacitor 17 to be charged or discharged to perform the write to memory cell 1. Namely, when the input data is at a "H" level, memory capacitor 17 is charged to cause the gate potential of transistor 15 to attain a "H" level and conversely, when the input data is at a "L" level, memory capacitor 17 is discharged to cause the gate potential of transistor 15 to attain a "L" level. Then, when the write is completed, writing word line 5 attains a "L" level to turn off transistor 14. However, the gate potential of transistor 15 is maintained at the attained level for a fixed time, (normally several hundreds mm seconds) by memory capacitor 17. In this way, the input data is stored in memory cell 1.

The data reading from memory cell 1 will be performed as follows.

The potential on reading word line 6 is set to a "H" level by the reading word line selecting signal to turn on transistor 16. As a result, reading bit line 4 is caused to have the potential corresponding to the conduction state of transistor 15. Namely, when "L" is written in memory cell 1, transistor 15 is in an off state, so that precharging transistor 7 supplies a high voltage from power supply line 19 to reading bit line 4, which line 14 attains a "H" level. Conversely, when "H" is written in memory cell 1, transistor 15 is in an on state. In this case, therefore, all of transistor 15 and 16 serially connected between power supply line 19 and ground 18 and precharging transistor 7 are in the on state, so that current (through current) is generated which flows between power supply line 19 and ground 18. Thus, the power supply voltage is supplied to reading bit line 4, which voltage is divided by a ratio of a sum of on-resistances of transistors 15 and 16 to the on-resistance of transistor 7.

However, since transistors 15 and 16 are set to have larger current drivability than that of precharging transistor 7, the sum of the on-resistances is small enough to the on-resistance of transistor 7. Therefore, the potential on reading bit line 4 is lowered to a "L" level by a low potential 0 V of ground 18. In this way, in data reading, inversion of the storage data of memory cell 1 is read onto reading bit line 4.

The data read on reading bit line 4 is amplified (level sensing) by sense amplifier 102 of FIG. 10. The necessity and the operation principle of sense amplifier 102 will be described.

The potential on reading bit line 4 will be represented as follows in the cases where the storage data of memory cell 1 is at a "H" and a "L".

When the storage data of memory cell 1 is at a "H":

$$(V_{cc} - V_{th}) \times \left( \frac{R15 + R16}{R15 + R16 + R7} \right) \quad (1)$$

When the storage data of memory cell 1 is at a "L":

$$V_{cc} - V_{th} \quad (2)$$

wherein, Vth denotes a threshold voltage of precharging transistor 7 and R7, R15 and R16 denote on-resistance value of precharging transistor 7, on-resistance value of transistor 15 and on-resistance value of transistor 16, respectively. According to the principle of the data reading from memory cell 1 to reading bit line 4 described above, the potential on reading bit line 4 is preferably a ground potential when the storage data of memory cell 1 is at a "H" and the potential of the same is preferably a power supply potential Vcc when the storage data of memory cell is at a "L". That is, a difference (which is referred to as a logical amplitude of the bit line) between the potentials on reading bit line 4, one of which potentials is when the storage data of memory cell 1 is at a "H" and the other is when the data is at a "L", is preferably as large as a difference between a power supply potential Vcc and a ground potential. However, as is clear from the above-described expression (1), when the storage data of memory cell 1 is at a "H", the potential on reading bit line 4 is higher than the ground potential (=0 V). On the other hand, as is clear from the above-described expression (2), when the storage data of memory cell 1 is at a "L", the potential on reading bit line 4 is lower than the power supply potential Vcc. Therefore, the logical amplitude of reading bit line 4 is considerably smaller than the difference between the power supply potential vcc and the ground potential. Therefore, it is difficult to determine whether the read data corresponds to logical values "0" or "1" if the potential on reading bit line 4 is simply inverted to be the reading data. Thus, sense amplifier 102 which is an amplifier of high sensitivity is required. Sense amplifier 102 is a differential amplifier inputting the potential on reading bit line 4 and a differential signal obtained by inverting the potential on reading bit line 4 by invertor 13.

Transistors 15 and 16 shown in FIG. 12 are referred to as a storage transistor and a reading transistor, respectively, in the following description.

FIG. 14 is a circuit diagram showing the internal arrangement of sense amplifier 102.

Referring to FIG. 14, sense amplifier 102 includes a series-connected circuit comprising a P channel MOS transistor TR2 and an N channel MOS transistor TR3 provided in parallel between power supply line 19 and ground 18 and a series-connected circuit comprising a P channel MOS transistor TR1 and an N channel MOS transistor TR4. The gates of transistors TR3 and TR4 are connected to the output ends of reading bit line 4 and invertor 13, respectively, in FIG. 10. The gates of transistors TR1 and TR2 are connected to the nodes between transistors TR2 and TR3 and the node between transistors TR1 and TR4, respectively. The potential 0 at the node between the transistors TR2 and TR3 and the potential $\overline{0}$ at the node between transistors TR1 and TR4 are applied to reading data buffer 104 as the output of this sense amplifier in FIG. 10.

In the data reading, the potentials of the complimentary logical levels represented by the above-described equations (1) and (2) are applied to the respective gates of transistors TR3 and TR4 from reading bit line 4 and invertor 13, respectively. When the gate potential of transistor TR3 is higher than that of transistor TR4, transistor TR3 is turned on, so that the source potential of transistor TR2 is lowered by the potential 0 V. In response thereto, transistor TR1 is turned on, so that the potential at the node between transistors TR1 and TR4 is raised by the power supply potential Vcc. Since the potential at the node between transistors TR1 and TR4 serves to turn off transistor TR2, the potential at the node between transistors TR2 and TR3 is reliably lowered to the ground potential 0 V. Thus, the potential at the node between transistors TR2 and TR3 ultimately attains the potential 0 V of ground 18 and the potential at the node between transistors TR1 and TR4 becomes the power supply potential Vcc. Similarly, when the gate potential of transistor TR4 is lower than that of transistor TR3, the transistor TR4 is turned on, so that the potential at the node between transistors TR2 and TR3 conversely becomes the power supply potential Vcc and the potential at the node between transistors TR1 and TR4 becomes the ground potential 0 V.

As the foregoing, this sense amplifier further lowers the potential of the "L" level represented by equation (1) to 0 V, further increases the potential of the "H" level represented by equation (2) to the power supply potential Vcc, which is developed at the node between transistors TR2 and TR3 and the node between transistors TR1 and TR4. In this way, the potentials at the two output ends of the sense amplifier are complimentarily changed in response to a gate potential difference between transistors TR3 and TR4 to output the power supply potential Vcc and the ground potential 0 V as the logical levels "H" and "L". Accordingly, the potential level read from memory cell 1 onto the corresponding reading bit line 4 in FIG. 11 is amplified by sense amplifier 102 to be output to reading data buffer 104.

Reading data buffer 104 is a circuit having a latching function which accepts the read data amplified by sense amplifier 102 at a predetermined timing in response to above-described reading clock signal RCK and outputs the same.

Again referring to FIG. 10, in the data reading, the inversion of the storage data is read from all the memory cells connected to reading word line 6 attaining a "H" level to the corresponding reading bit line 4. However, since only the reading bit line access transistors 8a and 8b provided corresponding to the reading bit line 4 connected to the selected memory cell are turned on, sense amplifier 102 is supplied with only the potential corresponding to the storage data of the selected memory cell.

FIG. 13 is a timing chart showing the operation of the serial access memory shown in FIG. 11 in data reading, taking as an example a case where the reading bit line 4 provided corresponding to one output terminal $A_0$ of address pointer 114 is selected.

Referring to FIGS. 11 through 13, in the data reading, the output of a "H" level is sequentially outputted from the output terminals $A_0$–$A_n$ of address pointer 114 only in one cycle of the reading clock signal RCK in synchronization with a periodical rise of the reading clock signal RCK (FIG. 13(a)). Thus, the voltage of a "H" level is outputted from the output terminal $A_0$ for example, in a (k−1)th (k=2, 3, ...) cycle period, of the reading clock signal RCK, as shown in FIG. 13(b). In the period when a signal of a "H" level is outputted from the output terminal $A_0$, the data is read from the memory cell connected to the reading word line 6 supplied with a potential of a "H" level as a reading word line selecting signal and to the reading bit line 4 corresponding to the output terminal $A_0$. Namely, when the storage data of this memory cell is at a "H", the potential on the reading bit line 4 corresponding to the output terminal $A_0$ is lowered from a precharge potential (Vcc−Vth) to the potential (>0 V) obtained by equation (1), as shown in FIG. 13(c). Thereafter, when data is read from the other memory cells connected to the reading bit line 4 and having the storage data of "L", the potential on this reading bit line 4 is gradually increased from the potential obtained by equation (1) to the precharge potential (vcc−Vth), as shown in FIG. 13(d). The potential on this reading bit line 4 is amplified by sense amplifier 102 by using the inversion potential thereof and then applied to reading data buffer 104. Meanwhile, reading data buffer 104 accepts the output of sense amplifier 102 in synchronization with the rise of the reading clock signal RCK. According, as shown in FIG. 13(e), the potential which reading bit line 4 ultimately attains during the period when the output of the output terminal $A_0$ of address pointer 114 is at a "H" level is outputted to data output terminal 106 in one cycle (k-th) subsequent to the (k−1)th cycle period of the reading clock signal RCK. In this way, in a conventional serial access memory, the potential level read onto reading bit line 4 connected to the selected memory cell is sensed and all the other reading bit lines 4 are precharged to (Vcc−Vth), in one cycle period of the reading clock signal RCK.

The arrangement of reading address pointer 114 will be briefly described with reference to FIG. 15.

FIG. 15 is a circuit diagram showing the internal arrangement of address pointer 114.

Referring to FIG. 15, the address pointer includes (n +1) D flip-flops F0–Fn and two-input AND gates G0–Gn. Each D flip-flop accepts and holds a voltage applied to a data terminal D as data in synchronization with a rise (or a fall) of a clock signal applied to a clock terminal CK and outputs the same from an output terminal Q. Therefore, the change of the voltage applied to data terminal D is transmitted to each output of flip-flops F0–Fn with the delay by one cycle of the reading clock signal RCK.

Each of flip-flops F0–Fn has the clock terminal CK receiving the above-described reading clock signal RCK and the data terminal D receiving the output of the flip-flop in the preceding stage. Thus, the potential change at the data terminal D of the flip-flop F0 is sequentially transmitted to the output terminals Q of flip-flops F1-Fn, until the delay by one cycle of the reading clock signal RCK.

AND gates G0-Gn are provided corresponding to flip-flops F0-Fn, and receive the output of the corresponding flip-flops and the reading clock signals RCK as input. The outputs of AND gates G0-Gn are outputted to the output terminals $A_0$-$A_n$ of address pointer 114, respectively, in FIG. 10. Therefore, each of AND gates G0 -Gn outputs a signal voltage of a "H" level only when both the voltage developed at the corresponding output terminal Q and the reading clock signal RCK are at a "H" level. However, delay by one cycle of the reading clock signal RCK in the potential change at the output terminal Q of each of flip-flops F0-Fn appears at the output terminal Q of the flip-flop in the succeeding stage. Therefore, the signal voltage rendering the output of AND gates G0-Gn to a "H" level is transmitted to the output terminal Q of each of flip-flops F0-Fn with the delay by one cycle of the reading clock signal RCK, so that the output of AND gates G0-Gn sequentially attain a "H" level for a fixed period. As a result, reading bit line access transistors 8a and 8b provided corresponding to each reading bit line 4 are sequentially turned on for a fixed time period in FIG. 10.

As the foregoing, in the semiconductor memory device having two bit lines of a reading bit line and a writing line provided for each memory cell column represented by a conventional serial access memory, the precharging transistor for precharging a bit line is always in an on-state. Therefore, through current is increased during the data reading to cause such problems as follows.

Namely, in the serial access memory shown i FIG. 10, each of all the transistors 7 has a gate and a drain connected to power supply line 19 so that all the bit lines 4 are always electrically connected to power supply line 19 at any time. Therefore, the through current flows for a period when reading is carried out from power supply line 19 to ground 18 through a memory cell which storage data is at a "H" level among the memory cells 1 connected to the selected reading word line 6 during the data reading, that is, when the reading word line 6 is at a "H" level. For example, in the worst case, that is, where "H" is written in all the memory cells 1, through current flows from power supply line 19 to ground 18 through precharging transistor 7, reading bit line 4, storage transistor 15 and reading transistor 16 in all the memory cells connected to the reading word line 6 corresponding to the selected memory cell until the end of the reading in the period when any memory cell is selected. Namely, in such a case, the through current flows through all the reading bit lines at any time during the data reading.

If the through current is large, the ground potential attains a higher level than the original level ($=0$ V) or the power supply potential attains lower level than the original level Vcc to fluctuate levels of the ground potential and the power supply potential. It has already been found that such a fluctuation in potential level as a reference for the operation of the memory is one of the reasons of the reduced time for discharging memory capacitor 17 in memory cell 1, that is, the time for maintaining data of the memory cell, which should be avoided as much as possible. In addition, if the current flowing in the memory during the operation is large, power consumption of the memory is increased, so that the amount of heat generation of the memory chip containing the memory is increased or the power supply load of the entire system containing the memory is increased. Thus, it is desirable that such through current as described above is as small as possible.

Furthermore, if the storage data of the selected memory cell is at a "H", precharging transistor 7 is in the on state at any time during the data reading, whereby the corresponding reading bit line 4 is drawn to a low potential 0 V of ground 18 by storage transistor 15 and reading transistor 16 (see FIG. 12) in the selected memory cell, while a high voltage is supplied from power supply line 19 by precharging transistor 7 connected to the reading bit line 4. Therefore, it takes time for reading bit line 4 to attain a "L" level. In order to accurately output the storage data of the selected memory cell to sense amplifier 102 of FIG. 10, the potential level of the reading bit line 4 corresponding to the selected memory cell should attain the original level that should be attained (expressed by the above described equations (1) and (2)) corresponding to the storage data of the selected memory cell. Therefore, it is necessary to output the signal amplified by sense amplifier 102 after the reading bit line 4 attained the original level as the reading data to buffer 106. As the foregoing, reading bit line 4 takes time in attaining a potential of a "L" level, which means that it is difficult to rapidly read the data from the memory cell having the storage data of "H".

Referring to FIG. 12, when the storage data of memory cell 1 is at a "H", the potential on the corresponding reading bit line 4 is ultimately lowered to the level obtained by the above-described equation (1) by the through current but does not attain 0 V during the data reading from the memory cell 1. Therefore, the logical amplitude of the conventional serial access memory is small that a differential amplification type sense amplifier (FIG. 14) is used therein. However, arrangement of sense amplifiers allowing accurate amplification of two input voltages having a small voltage difference to a predetermined level requires very complicated adjustments of a threshold, a size of a transistor constituting the sense amplifier or the like in manufacture. Thus, a conventional serial access memory comprising a sense amplifier of a complicated arrangement is difficult to manufacture.

In recent years, especially as memories increase in capacity, the number of memory cells connected to one word line is increased, which results in large through current during data reading, causing such problems as described above.

In order to reduce the through current, proposed is a method of increasing an on-resistance value of precharging transistor 7 by reducing current drivability (size) of the precharging transistor 7 of FIG. 12. However, a reduced size of a precharging transistor causes the following problems.

For example, after data is read from a memory cell to cause the potential level on the corresponding reading bit line 4 to attain a "L", when data is read from the other memory cells connected to this reading bit line 4 and having the storage data of "L", this reading bit line 4 should rapidly attain a "H" level during the data reading to allow the data reading to be performed at a high speed. However, if the size of precharging transistor 7 is small, the current amount flowing from power supply line 19 through precharging transistor 7 to reading bit line 4 is reduced, so that more time is required for the potential level of the reading bit line 4 to rise to a "H"

by the power supply voltage. Namely, since more time is required for the reading bit line 4 to be completely precharged to a "H" level by precharging transistor 7 (a time required for reading bit line 4 to attain the potential (Vcc−Vth) in FIG. 13(d)), it is not possible to immediately read the data from the memory cell connected to the reading bit line 4 once attaining a "L" level and having the storage data of "H".

SUMMARY OF THE INVENTION

Therefore, an object of the present invention is to provide a semiconductor memory device consuming less power than a conventional device does.

Another object of the present invention is to provide a semiconductor memory device capable of reading at a higher speed than that of a conventional device.

A further object of the present invention is to provide a semiconductor memory device having a large logical amplitude.

Still another object of the present invention is to provide a semiconductor memory device requiring no sense amplifier.

A still further object of the present invention is to provide a semiconductor memory device operating with less power consumption without the deterioration of a reading speed.

A still further object of the present invention is to provide a semiconductor memory device capable of operating at a high speed with less power consumption than that of a conventional device and having a sufficiently large logical amplitude.

In order to attain above-described objects, the semiconductor memory device according to the present invention includes a plurality of memory cells arranged in matrix of rows and columns, writing word lines each corresponding to a respective one of the rows and reading word lines each corresponding to a respective one of the rows, writing bit lines each corresponding to a respective one of the columns and reading bit lines each corresponding to a respective one of the columns, a selecting circuit for selecting one of the reading bit lines in a first predetermined period, precharging circuits each corresponding to a respective one of reading bit lines for precharging the corresponding reading bit lines to a predetermined potential, and a first activating circuit responsive to the selection output from the selecting circuit for activating the precharging circuits provided corresponding to the reading bit lines selected by the selection output for a second predetermined period shorter than the first predetermined.

The semiconductor memory device according to the present invention further includes switching circuits each corresponding to a respective one of reading bit lines for extracting potentials on the corresponding reading bit lines, and a second activating circuit for activating the switching circuits corresponding to the precharging circuits during a third predetermined period until the end of the first predetermined period after the precharging circuits are activated by the first activating circuit for the second predetermined period.

Therefore, in data reading, each of the precharging circuits is activated only in a period when the corresponding reading bit line is selected by the selecting circuit to precharge the corresponding reading bit line. Each of the precharging circuits provided corresponding to each reading bit line is activated only in a portion of the period of the predetermined period when the corresponding reading bit line is selected, so that only the selected reading bit line is precharged and then the potential thereof is extracted, in the period when any reading bit line is selected. Namely, in this semiconductor memory device, a reading bit line to be precharged is only the one selected by the selecting circuit and the period when the precharging is carried out is shorter than that when a single reading bit line is selected by the selecting circuit. Therefore, the total amount of current flowing through a reading bit line is for precharging during the data reading is drastically reduced in the period when any reading bit line is selected as compared with a conventional example where all the precharging circuits always precharge the corresponding reading bit lines.

According to a preferred embodiment, the arrangement of this semiconductor memory device is applicable to a serial access memory. In such a case, it is structured such that, for example, an address pointer functions as a selecting circuit and first and second activating circuits.

Namely, the address pointer includes a first signal applying circuit for applying a first signal for designating a second predetermined period and a second signal applying circuit for applying a second signal for designating a third predetermined period. The first signal applying circuit serves as both the first activating circuit and the selecting circuit. The second signal applying circuit serves as both the selecting circuit and the second activating circuit. The first signal applying circuit sequentially applies the first signal to one of the precharging circuits for every first predetermined period. Meanwhile, the second signal applying circuit sequentially applies the second signal to one of the extracting circuits for every first predetermined period at a timing delayed from the first signal applying circuit by a time period equivalent to the second predetermined period.

Preferably, each precharging circuit includes an N channel MOS transistor having a gate receiving the first signal, a drain connected to the corresponding reading bit line and a source connected to a power supply and each switching circuit includes an N channel MOS transistor having a source connected to the corresponding reading bit line, a drain and a gate receiving the second signal.

Preferably, the first signal applying circuit and the second signal applying circuit commonly include the same number of flip-flops as that of the columns connected in series to constitute a shift resistor.

Each flip-flop is controlled by an external clock signal to apply first and second output signals having logical levels complementary from each other. The first signal applying circuit further includes a two-input AND gate provided corresponding to each flip-flop. Each AND gate receives the first output signal of the corresponding flip-flop and the external clock signal to output the first signal. The second signal applying circuit further includes a two-input NOR gate provided corresponding to each flip-flop. Each NOR gate receives the second output signal of the corresponding flip-flop and the external clock signal to output the second signal.

With the first and the second signal applying circuits arranged as the foregoing, "H" level signals are applied as the first and second signals to the precharging circuit and the switching circuit, respectively, from the address pointer. Meanwhile, both the precharging circuit and the switching circuit include N channel MOS transistors. Therefore, each reading bit line is precharged to a potential lower than the power supply potential by a threshold voltage of the N channel MOS transistor in the first half of the period when the "H" level signal is applied to any of the corresponding precharging circuit and the corresponding switching circuit and then the potential thereof is extracted in the second half of the period.

According to another aspect of the present invention, the semiconductor memory device according to the present invention includes a plurality of memory cells arranged in matrix of rows and columns, writing word lines each corresponding to a respective one of the rows and reading word lines each corresponding to a respective one of the rows, writing bit lines each corresponding to a respective one of the columns and reading bit lines each corresponding to a respective one of the columns, a selecting circuit for selecting one of the reading bit lines in a predetermined period, precharging circuits each corresponding to a respective one of the reading bit lines for precharging the corresponding reading bit lines to a predetermined potential, and an activating circuit for activating each precharging circuit only in a predetermined period when the corresponding bit line is selected by the selecting circuit. Thus, each of the reading bit lines are precharged only when it is selected by the selecting circuits. Namely, a period when any reading bit line is electrically connected to the corresponding precharging circuit is restricted by a time period when the selecting circuit selects one reading bit line. Therefore, the total amount of current flowing through the reading bit lines when the reading bit lines are precharged during the data reading is drastically reduced when any reading bit line is selected by the selecting circuit as compared with a case where all the reading bit lines are precharged by the corresponding precharging circuits.

According to a preferred embodiment, the arrangement of this semiconductor memory device is applicable to a serial access memory. In such a case, it is structured such that an address pointer serves as both a selecting circuit and an activating circuit.

Namely, the address pointer includes a signal applying circuit for sequentially applying to one of the precharging circuits a signal for designating a predetermined period in every predetermined period. Preferably, each precharging circuit includes an N channel MOS transistor having a gate receiving the designating signal, a drain connected to the corresponding reading bit line and a source connected to a power supply.

Preferably, the signal applying circuit includes the same number of flip-flops as that of the columns connected in series for constituting a shift resistor and a two-input AND gate provided corresponding to a respective one of the flip-flops. Each AND gates each the output of the corresponding to a respective one of the flip-flops and the external clock signal to outputs the designating signal.

With the signal applying circuit arranged as the foregoing, each reading bit line is precharged to a potential lower than the power supply potential by a threshold voltage of the N channel MOS transistor only for the period when a "H" level signal is applied to the corresponding precharging circuit as a designating signal.

According to a further aspect, the semiconductor memory device according to the present invention comprises a plurality of memory cells arranged in a plurality of columns, reading bit lines each corresponding to a respective one of columns, a selecting circuit for selecting one of the reading bit lines, and precharging circuits each corresponding to a respective one of the reading bit lines for precharging each reading bit line to a predetermined potential only for a period when the corresponding bit line is selected by the selecting circuit.

According to a preferred embodiment, each memory cell of the semiconductor memory device according to the present invention is comprised of three MOS transistors and one capacitor, similar to a DRAM (dynamic random access memory).

As the foregoing, according to the present invention, since the precharging circuit is activated only for a period when the corresponding reading bit line is selected, through current flowing through the reading bit lines for precharging during the data reading can be drastically reduced as compared with an conventional device. As a result, the power consumption during the data reading is reduced and time required for the potential on the reading bit line to attain a "L" level and a "H" level is reduced to obtain a semiconductor memory device operating at a higher speed than a conventional device does.

Furthermore, according to the present invention, it is also possible to precharge each reading bit line only for the first half of the predetermined period when the bit line is selected by the selecting circuit. Therefore, the through current flowing through the reading bit line during the data reading can be reduced to enable the increase of the current drivability of the precharging circuit more than in the conventional example. As a result, the time required for the potential on the reading bit line to increase to a "H" level can be reduced. Meanwhile, in the second half of the predetermined period, the precharging circuit is disabled to lower the potential on the corresponding reading bit line than a conventional potential at a high speed. Therefore, time required for the potential on the reading bit line to be lower to a "L" can be also reduced. As a result, a semiconductor memory device can be obtained requiring less power consumption and no sense amplifier and capable of reading at a high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
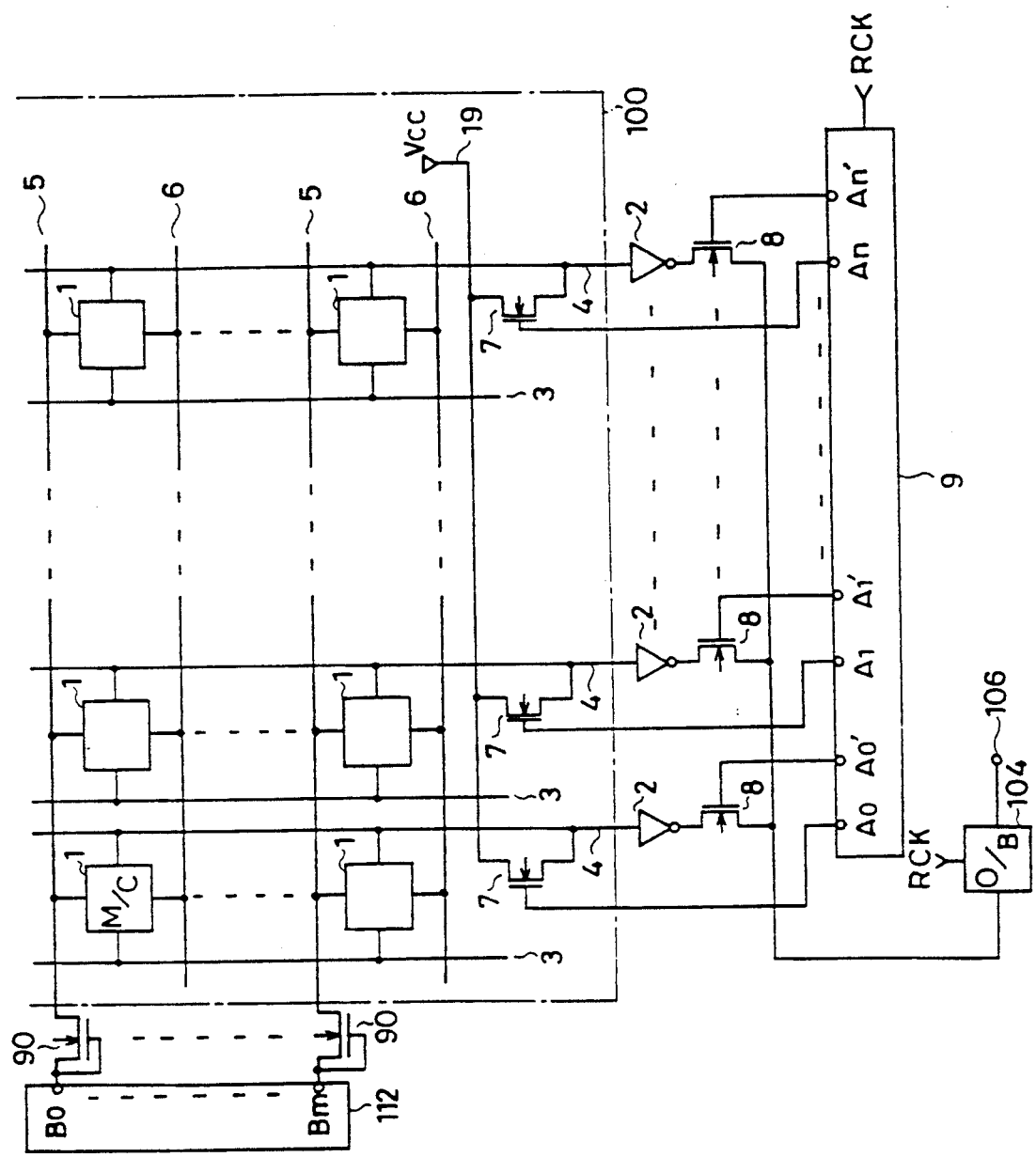
FIG. 1 is a partial circuit diagram of a serial access memory according to one embodiment of the present invention.
Figure 10:
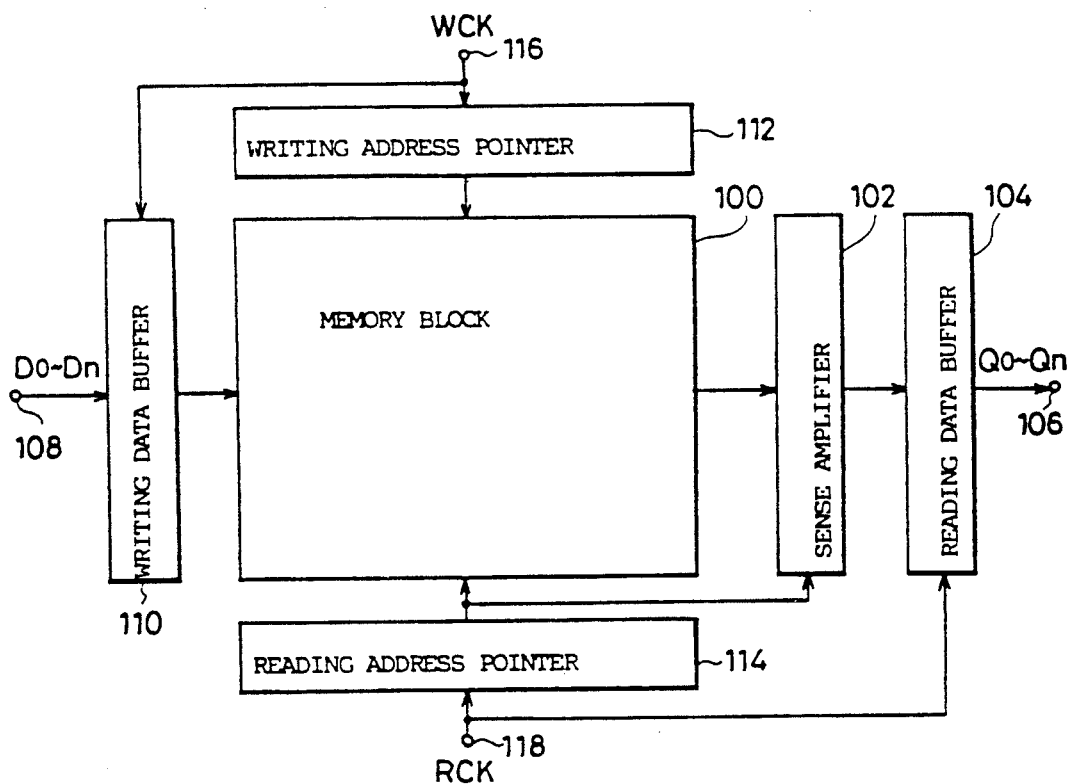
FIG. 10 is a schematic block diagram showing entire arrangements of the embodiment and a conventional serial access memory.
Figure 11:
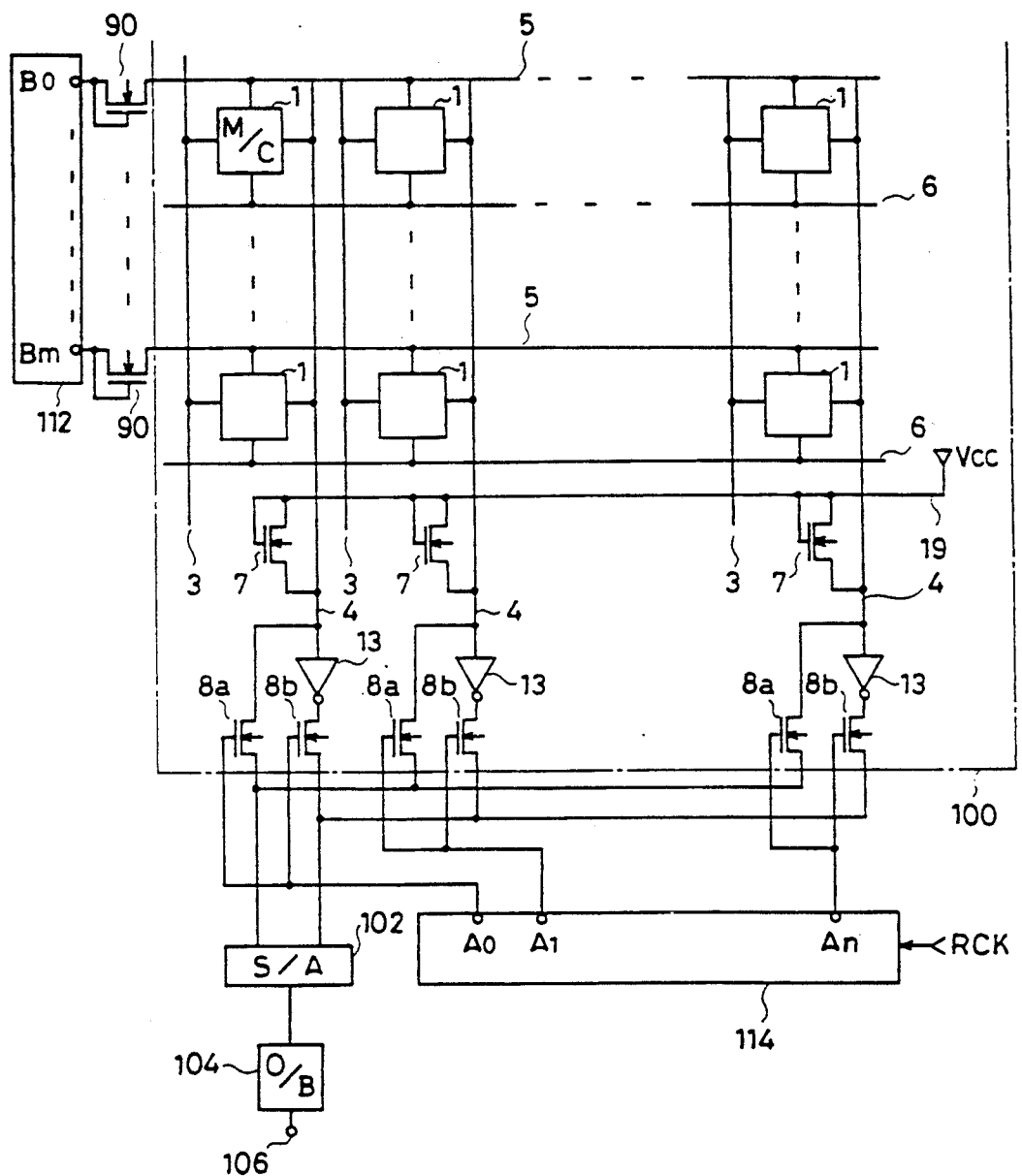
FIG. 11 is a partial circuit diagram of the conventional serial access memory.
Figure 12:
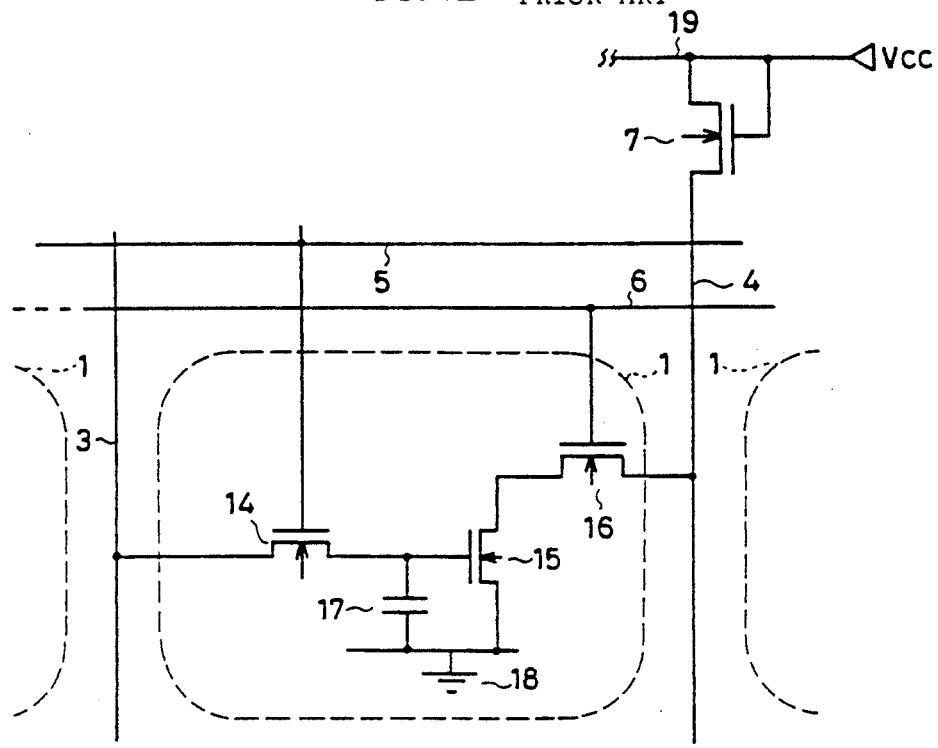
FIG. 12 is a circuit diagram showing an internal arrangement of a memory cell of the conventual serial access memory.
Figure 13:
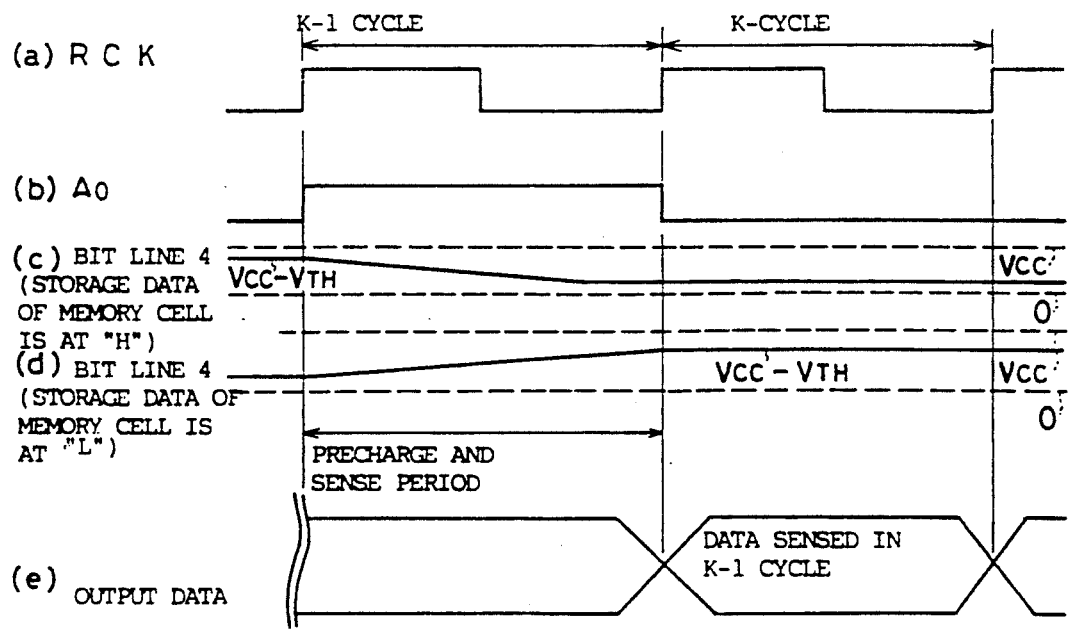
FIG. 13 is a timing chart showing a potential change of a reading bit line in the conventional serial access memory.

FIG. 1 is the schematic block diagram showing the part of the serial access memory according to one embodiment of the present invention. FIG. 1 mainly shows an arrangement of a memory block 100 memory and a connection between memory block 100 and an address pointer 114 and a reading data buffer 104, in this serial access memory. The entire arrangement of this serial access memory is the same as that of the conventional one shown in FIG. 10. The internal arrangement of memory cell 1 and connections between memory cell 1 and a writing word line 5 and a reading word line 6 and between memory cell 1 and a writing bit line 3 and a reading bit line 4 are the same as described in "Background Art". Further, the connection between the writing word lines 5 and an address pointer 112 and the operation of the address pointer 112 are the same as described in "Background Art".

Referring to FIG. 1, in memory block 100, a gate of a precharging transistor 7 is connected to an address pointer 9 differently from the case in the conventional serial access memory. Address pointer 9 further includes n+1 output terminals $A_0'-A_n'$ in addition to the output terminals $A_0-A_n$ which the conventional address pointer has, and operates as follows.

Figure 3:
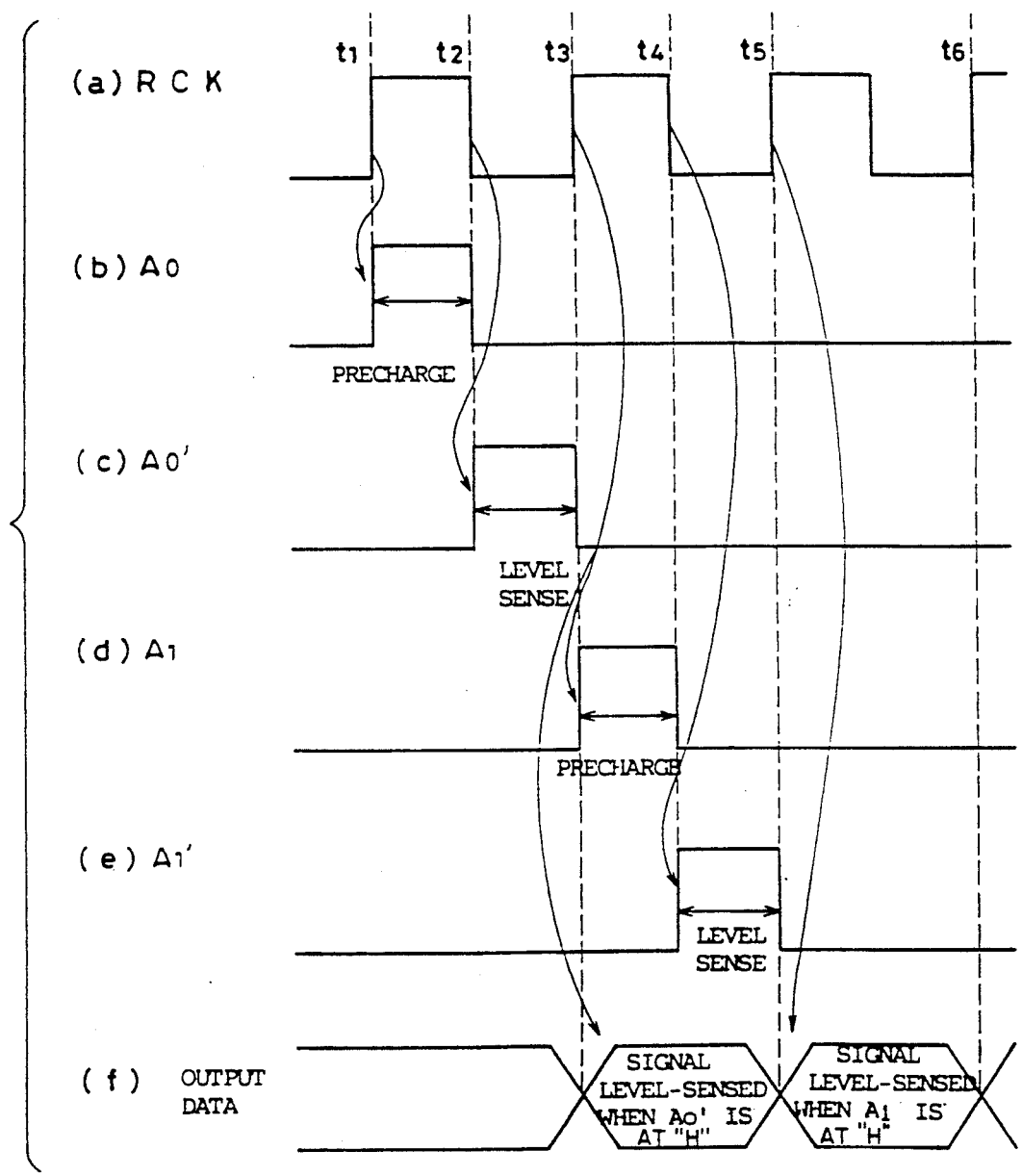
FIG. 3 is a timing chart showing the operation of the serial access memory shown in FIG. 1.

FIG. 3 is a timing chart showing the operations of address pointer 114 and reading data buffer 104.

Referring to FIG. 3, in the data reading, address pointer 9 sequentially outputs a voltage of a "H" level to the output terminals $A_0-A_n$ and $A_0'-A_n'$ in the order of $A_0 \rightarrow A_0' \rightarrow A_1 \rightarrow A_1' \ldots A_n \rightarrow A_n'$ in synchronization with periodical rise and fall of the reading clock signal RCK (FIG. 3(a)) in a period half the one cycle of the reading clock signal RCK. FIGS. 3(b)-(f) show the signals outputted to the output terminals $A_0$, $A_0'$, $A_1$ and $A_1'$ as representatives.

In FIG. 1, the gates of all the precharging transistors 7 are connected to the output terminals $A_0$, $A_1$, ... $A_n$ of address pointer 9, respectively. Similarly in the conventional example, the reading word line 6 selected during the data reading is set to a "H" level during the one cycle of the reading clock signal RCK in synchronization with the rise of the reading clock signal RCK.

Thus, in the data reading, precharging transistor 7 can precharge the corresponding reading bit line 4 to the potential (Vcc−Vth) only in the period when a "H" level signal is outputted to the output terminal (one of $A_0-A_n$) of address pointer 9 connected to the gate of precharging transistor 7. Therefore, all the reading bit lines 4 are precharged for half the one cycle of the reading clock signal RCK, with the delay from each other by one cycle of the reading clock signal RCK.

Figure 5:
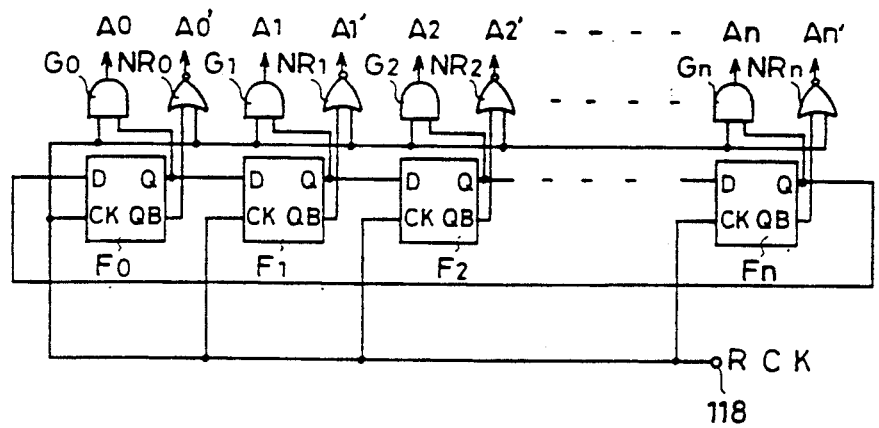
FIG. 5 is a circuit diagram showing one example of a specific arrangement of a reading address pointer in the serial access memory shown in FIG. 1.

FIG. 5 is the circuit diagram showing the arrangement of address pointer 9 in the serial access memory.

Figure 15:
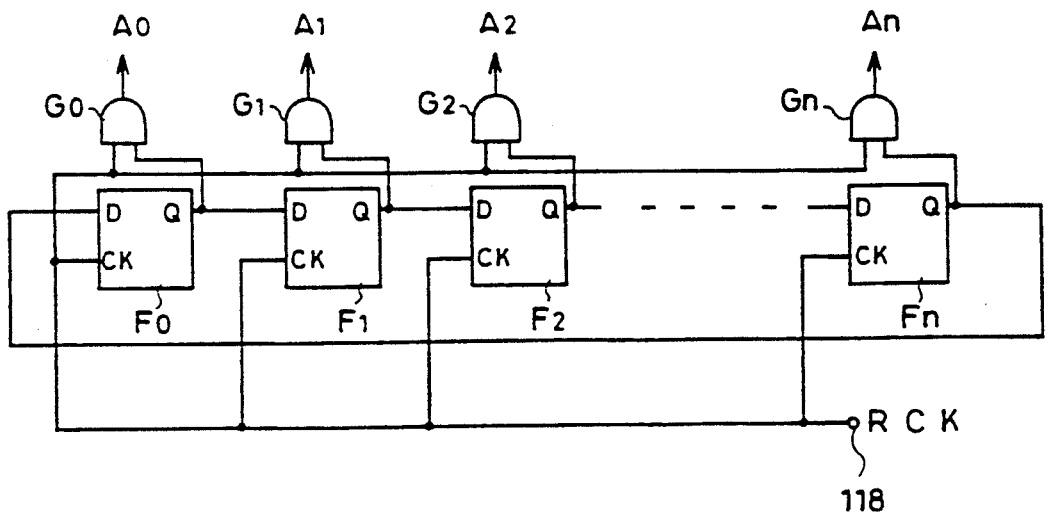
FIG. 15 is a circuit diagram showing an arrangement of a reading address pointer for use in the conventional serial access memory.

Referring to FIG. 5, the address pointer 9 of the present embodiment differs from the conventional one shown in FIG. 15 in that in the address pointer of the present embodiment, each of the n+1 flip-flops F0-Fn has an inversion output terminal QB for outputting an inversion signal of the signal outputted at the output terminal Q and the inversion output terminals QB of the flip-flops F0 -Fn are connected to two-input NOR gates NR0-NRn for inputting the reading clock signals RCK. The respective outputs of the n+1 NOR gates NR0-NRn are applied to the output terminals $A_0'-A_n'$ of the address pointer shown in FIG. 1.

In each of the flip-flops F0-Fn, the output terminal Q and the inversion output terminal QB output inversion and non-inversion of the voltage applied to the data terminal D, with a delay of one cycle of the reading clock signal RCK. Accordingly, if the reading clock signal RCK is such a clock signal as shown in FIG. 4(a) having a duty ratio of 1 to 1 in a fixed cycle, the signal outputted at the terminal Q is outputted from the inversion output terminal QB in each of flip-flops F0-Fn, with a delay of the half the cycle of the reading clock signal RCK. Meanwhile, each of the NOR gates NR0-NRn outputs a "H" level signal only when the potentials of the reading clock signal RCK and the corresponding output terminal Q are at a "L" level. Therefore, NOR gates NR0-NRn sequentially output "H" level signals in synchronization with the fall of the reading clock signal RCK. As a result, "H" level of "H" level voltages are applied from the NOR gates NR0-NRn to the output terminals $A_0'-A_n'$, with a delay of half the cycle of the reading clock signal RCK from the application of "H" level voltages to the output terminals $A_0-A_n$. Thus, such an operation as described above of address pointer 9 is implemented.

Figure 2:
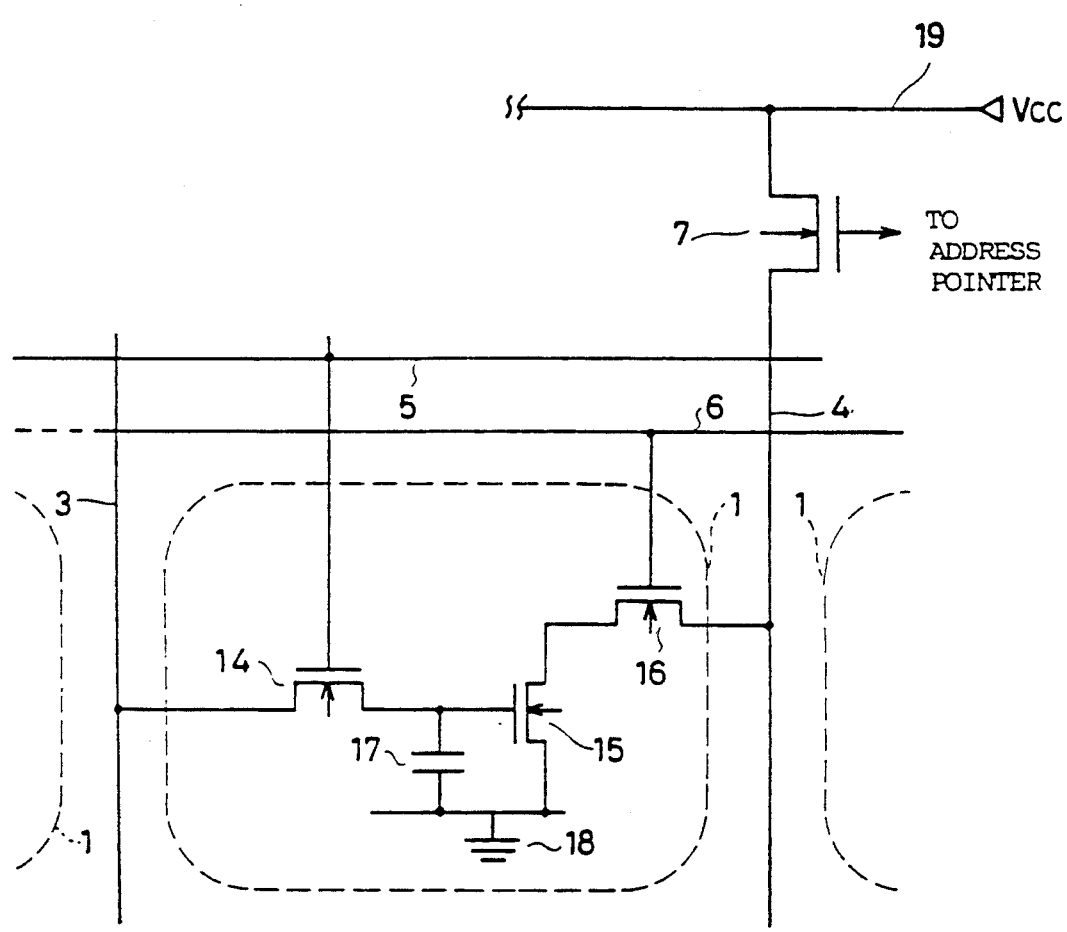
FIG. 2 is a circuit diagram showing the internal arrangement of the memory cell in FIG. 1.

FIG. 2 is the circuit diagram showing the internal arrangement of the arbitrary memory cell 1 in the present embodiment and the connection to the corresponding precharging transistor 7.

Referring to FIG. 2, since when the storage data of the selected memory cell 1 is at a "H", the corresponding precharging transistor 7 is in the on state at any time, through current flows from power supply line 19 to ground 18 through precharging transistor 7, reading bit line 4, storage transistor 15 and reading transistor 16. However, since the period when the "H" level voltage is applied to precharging transistor 7 is very short as compared with that of the conventional example, less through current flows through the selected reading bit line 4 during this period than that of the conventional one. Furthermore, none of precharging transistors 7 in FIG. 1 is turned on overlapping with the other precharging transistors 7, no through current flows through other reading bit lines than the reading bit line corresponding to the selected memory cell during the data reading. Therefore, the through current generated during the data reading can be drastically reduced as compared with the conventional one. For example, when through current becomes maximum, that is, even when the storage data of all the memory cells is at a "H", the through current does not flow through all the reading bit lines 4 all the time until the end of the data reading from all the memory cells but flows through only one selected reading bit line every time a reading bit line is selected by address pointer 114. Therefore, power consumption of this serial access memory becomes far less than that of the conventional one.

Again referring to FIG. 1, in the serial access memory according to the present embodiment, reading bit line 4 is directly connected to reading data buffer 104 through invertor 2 and N channel MOS transistor 8 without using a differential amplification type sense amplifier which is provided in the conventional serial access memory. In the serial access memory, the transistor 8 and the invertor 2 correspond to reading bit line access transistors 8a and 8b and sense amplifier 102, respectively in the conventional serial access memory shown in FIG. 7.

The gates of all the reading bit line access transistors 8 are connected to the output terminals $A_0'$, $A_1'$, ..., $A_n'$ of address pointer 9, respectively. As described above, address pointer 9 outputs "H" level signals to the output terminals $A_0$–$A_n$ in synchronization with the rise of the reading clock signal RCK, and sequentially outputs "H" level signals to the output terminals $A_0'$–$A_n'$ for the half period of the reading clock signal RCK. Namely, precharging transistor 7 is turned on in the first half of one cycle of the reading clock signal RCK and in the later half, reading bit line access transistor 8 provided corresponding to the reading bit line 4 connected to this precharging transistor 7 is turned on in place of precharging transistor 7.

Reading bit line access transistor 8 applies the voltage of reading bit line 4 inverted by sense amplifier 2 to reading data buffer 104 only in the on state. Namely, the data read onto reading bit line 4 is inverted and amplified by the corresponding invertor 2 to be applied to reading data buffer 104 as the final reading data. Thus, in the present embodiment, the first half and the latter half of one cycle of the reading clock signal RCK corresponded to a precharge period of the selected reading bit line 4 and a level sense period of the read data, respectively (see FIG. 3).

Figure 4:
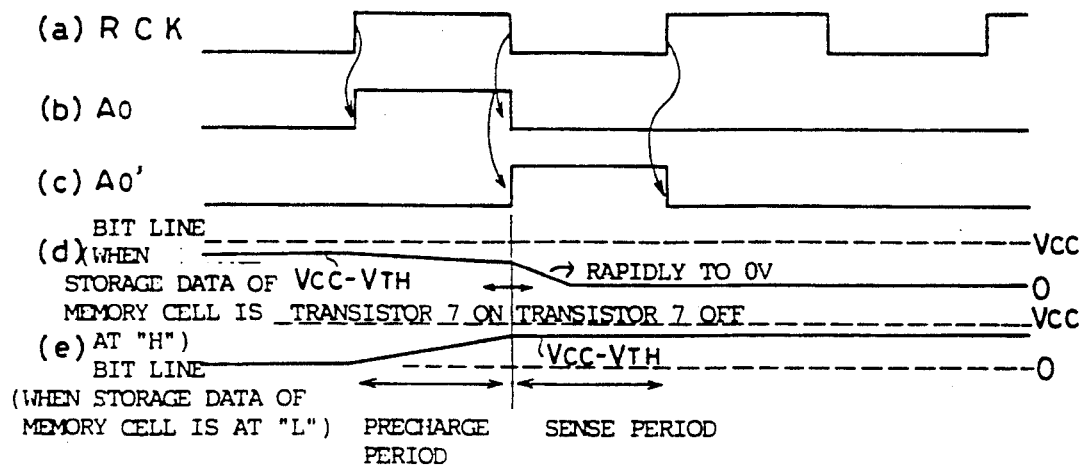
FIG. 4 is a timing chart showing a potential change of a reading bit line in the serial access memory shown in FIG. 1.

The potential change of reading bit line 4 in data reading will be described in detail with reference to FIG. 4. FIG. 4 is a timing chart showing the potential change of reading bit line 4 in the serial access memory according to the present embodiment, taking, as an example, the reading bit line corresponding to precharging transistor 7 and the reading bit line access transistor 8 connected to the output terminals $A_0$ and $A_0'$ of address pointer 9, respectively.

For example, in the period when the voltage (FIG. 4(b)) of the output terminal $A_0$ of address pointer 9 attains a "H" level in synchronization with the rise of the reading clock signal RCK (FIG. 4(a)) in the data reading, precharging transistor 7 connected to the output terminal $A_0$ is turned on. Therefore, when the storage data of the selected memory cell is at "H", the potential on the corresponding reading bit line 4 is gradually lowered from the precharge potential (Vcc–Vth) to the potential (>0 V) obtained from equation (1) (see FIG. 4(d)). However, when the reading clock signal RCK falls so that the voltage at the output terminal $A_0$ attains a "L" level, a precharging transistor 7 connected to the reading bit line 4 is turned off, so that the current path between storage transistor 15 and reading transistor 16, and power supply line 19 is cut off in all the memory cells, including this memory cell, provided corresponding to the reading bit lines 4 connected to this precharging transistor 7 and having the storage data of "H" (see FIG. 2). Thus, the through current path is cut off to prevent a supply of a high voltage from power supply line 19 to the corresponding reading bit lines 4, whereby the potential on the reading bit line 4 is rapidly lowered to the potential 0 V of ground 18 by storage transistor 15 and reading transistor 16 in the on state (see FIG. 4(d)).

Conversely, when the storage data of the selected memory cell is at "L" and the potential on the corresponding reading bit line 4 is set to a "L" level by the previously read data, the reading bit line 4 is precharged to a potential of Vcc–Vth by the corresponding precharging transistor 7 in the half cycle of the reading clock signal RCK wherein a "H" level voltage is outputted from the output terminal $A_0$. Then, in the next period when the output voltage of the output terminal $A_0'$ is at a "H" level, the corresponding reading bit line access transistor 8 is turned on, so that the potential level of the reading bit line 4 set in the previous period is sensed by invertor 2 to be applied to reading data buffer 104.

As the foregoing, the voltage which level is sensed by invertor 2 when reading the data from the memory cells having storage data of "H" attains a lower value (0 V) at a higher speed than that of the conventional one. Therefore, the logical amplitude of the read data in this serial access memory becomes (Vcc–Vth)–0, that is, Vcc –Vth, which is larger than that of the conventional one, and data reading from a memory cell having the storage data of "H" can be performed more rapidly than by the conventional one. As the foregoing, since the logical amplitude is large in the present embodiment, it is not necessary to amplify the voltage of the reading bit line 4 by a differential amplifier of high precision in data reading as is done in the conventional example. Therefore, in the present embodiment, invertor 2 of the simple arrangement is connected to each reading bit line 4 in place of a conventional differential amplification type sense amplifier.

Figure 6:
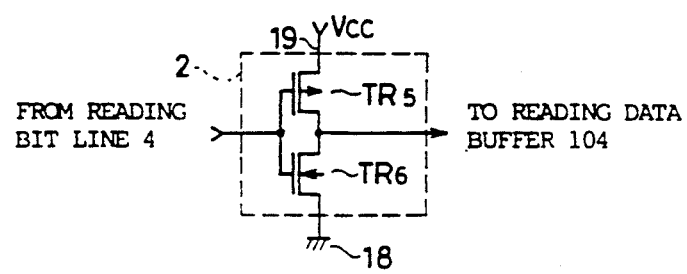
FIG. 6 is a circuit diagram showing one example of a specific arrangement of the invertor shown in FIG. 1.

FIG. 6 is the circuit diagram showing the arrangement of invertor 2.

Referring to FIG. 6, invertor 2 includes a P channel MOS transistor TR5 and an N channel MOS transistor TR6 connected in series between power supply line 19 and ground 18. The reading bit line 4 of FIG. 1 is connected to the gates of transistors TR5 and TR6, whereby the potential at the node between transistors TR5 and TR6 is applied to reading data buffer 104 of FIG. 1.

When the voltage of reading bit line 4 is at a "H" level (=Vcc–Vth), transistor TR5 is turned off and transistor TR6 is turned on, so that potential 0 V at ground 18 is outputted as the storage data of the selected memory cell at the node between transistors TR5 and TR6. Conversely, when the voltage of reading bit line 4 is at a "L" level (=0 V), transistor TR5 is turned on and transistor TR6 is turned off, so that the potential (=Vcc) on power supply line 19 is outputted as the storage data of the selected memory cell at the node between transistors TR5 and TR6. Namely, the logical amplitude Vcc–Vth of the potential appears on reading bit line 4 is slightly amplified by this invertor 2 by a threshold voltage Vth of precharging transistor 7.

As the foregoing, since in the present embodiment, the current is small which flows from power supply line 19 to ground 18 through precharging transistor 7 and memory cell 1 in data reading in FIG. 2, the size of precharging transistor 7 can be made larger than that of the conventional example. The increased size (current drivability) of precharge 7 allows reduction in time for precharging the reading bit line 4 connected thereto to a potential of a "H" level and reduction in time required for the reading bit line 4 to attain a potential of a "H" level by the data read from the memory cell. Therefore, the time required for data reading from memory cells having the storage data of "H" can be reduced. As a result, in this serial access memory, while the precharge period of reading bit line 4 is reduced to the half the conventional period, it is possible to sufficiently increase the potential on the reading bit line 4 to the potential (Vcc−Vth) of a "H" level during the precharge period by increasing the size of precharging transistor 7.

The description will be given of the switching timing of the output data of reading data buffer 104 in this serial access memory.

In FIG. 1, reading data buffer 104 operates similarly to the conventional one. More specifically, reading data buffer 104 accepts the input signal as the data to be held in response to the rise of the reading clock signal RCK to maintain the same until the next rise of the reading clock signal RCK and externally outputs the same. Thus, the output data of reading data buffer 104 is switched to the signal which is level sensed by invertor 2 immediately before that in synchronization with the rise of the reading clock signal RCK, as shown in FIG. 3(f).

For example, referring to FIG. 2, the data read onto the reading bit line 4 precharged in the period from t to $t_2$ and inverted and amplified by the corresponding invertor 2 during the period from $t_2$ to $t_3$ is outputted in the period from $t_3$ to $t_5$ from reading data buffer 104. Subsequently, the data level-sensed by the corresponding invertor 2 in the period from $t_4$ to $t_5$ after precharged in the period from $t_3$ to $t_4$ is outputted from reading data buffer 104 in the period from $t_5$ to $t_6$. In this way, reading data buffer 104 sequentially outputs the data read onto the reading bit lines 4 corresponding to the output terminal pairs of $A_0$ and $A_0'$ to $A_n$ and $A_n'$ of address pointer 9 for every cycle of the reading clock signal RCK.

Figure 7:
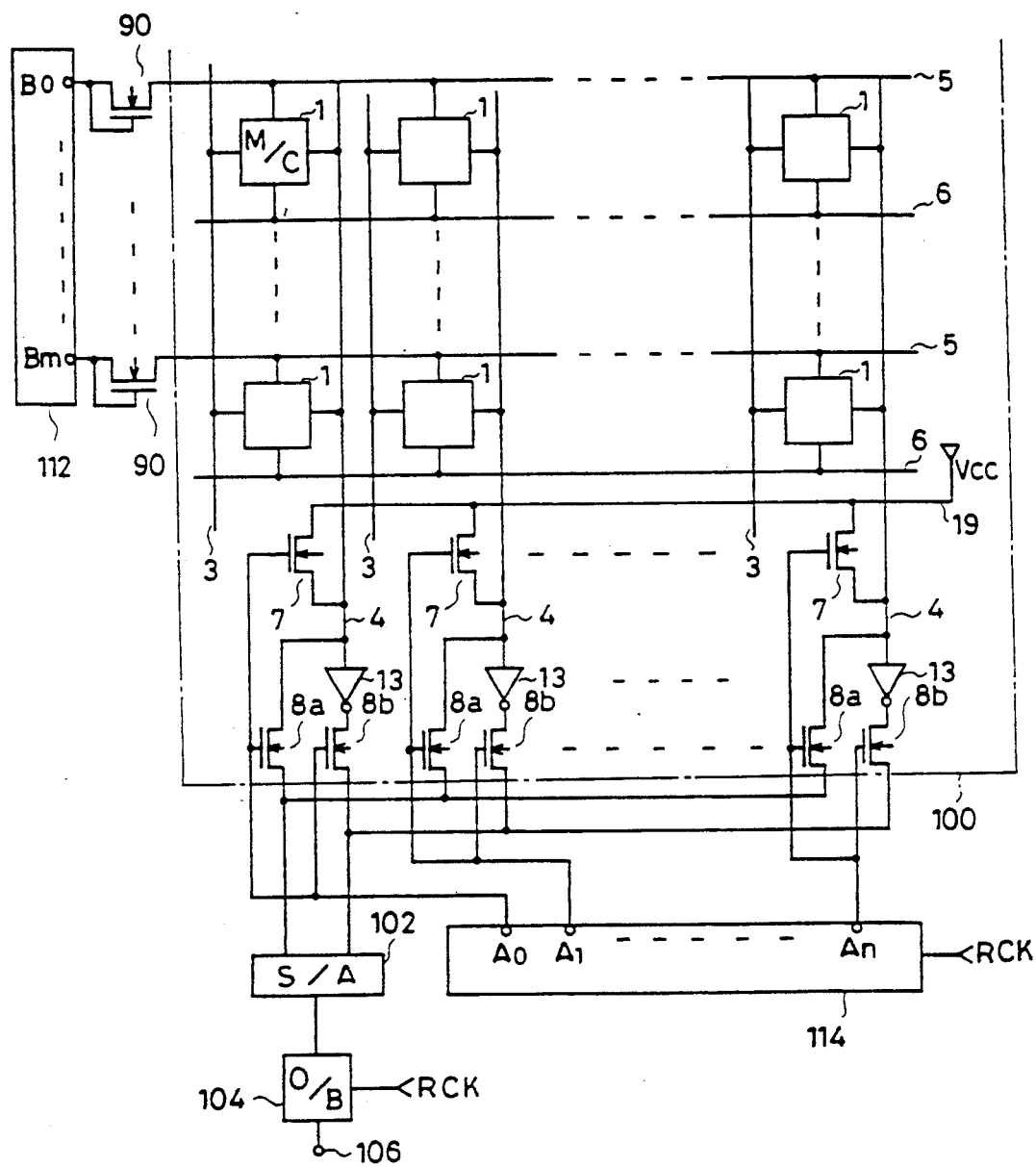
FIG. 7 is a partial circuit diagram of a serial access memory according to another embodiment of the present invention.

FIG. 7 is the partial schematic block diagram of the serial access memory according to another embodiment of the present invention. FIG. 7 mainly shows the arrangement of memory block 100 of the serial access memory and the connection between memory block 100 and address pointer 114, sense amplifier 102 and reading data buffer 104. The entire arrangement of this serial access memory is the same as that of the conventual serial access memory shown in FIG. 10. As in the previous embodiment, the internal arrangement of memory cell 1 and the connections between memory cell 1, and writing word line 5 and reading word line 6 and the connection between memory cell 1, and writing bit line 3 and reading bit line 4 are the same as those of the conventional one (see FIG. 2). Further, the operation of an address pointer 112 and the connection between the address pointer 112 and the writing word lines 5 are the same as those of the conventional one.

Referring to FIG. 7, differently from the conventional one, in this serial access memory, the gates of the respective precharging transistors 7 are connected, together with the respective gates of the corresponding reading bit line access transistors 8a and 8b, to the output terminals $A_0$–$A_n$ of address pointer 114, respectively. Address pointer 114 has the arrangement as shown in FIG. 15 and operates similarly to the conventional one. The reading word line 6 selected in the data reading is set to a "H" level only for one cycle of the reading clock signal RCK in synchronization with the rise of the reading clock signal RCK, similarly to the conventional one.

Figure 8:
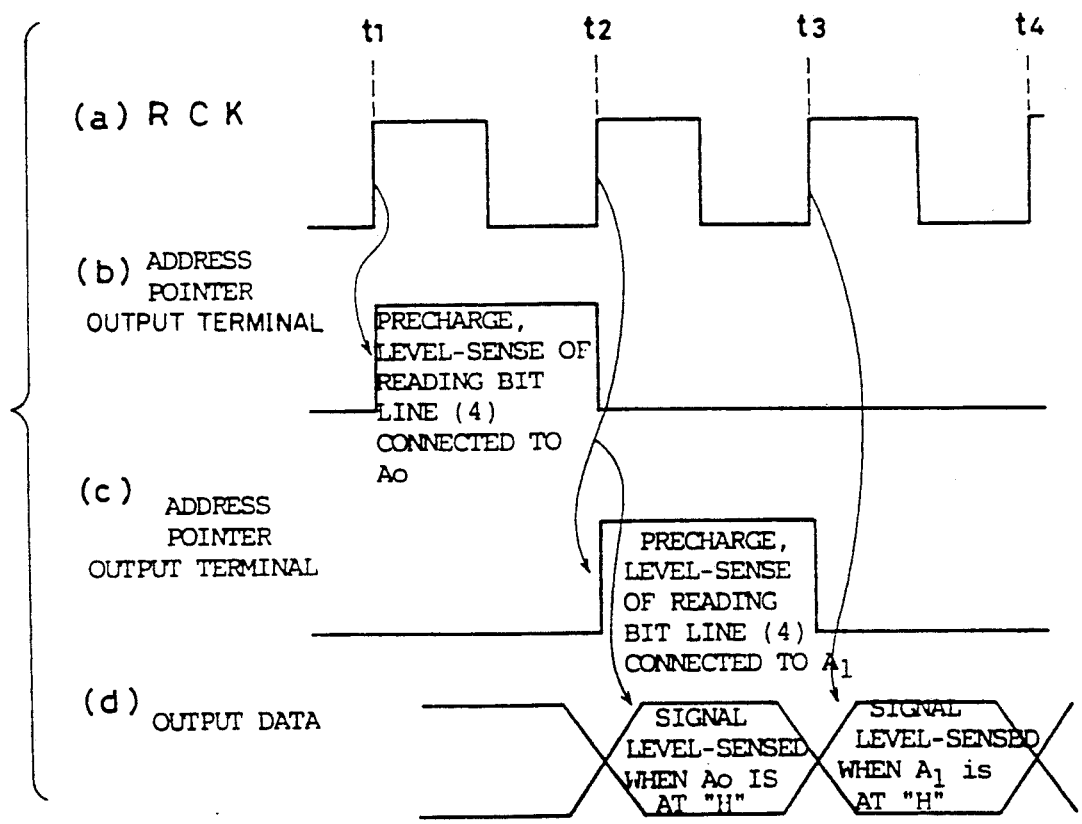
FIG. 8 is a timing chart showing the operation of the serial access memory shown in FIG. 7 during the data reading.

FIG. 8 is the timing chart showing the operations of address pointer 114 and reading data buffer 104.

Referring to FIG. 8, the reading clock signal RCK (FIG. 8(a)) rises in a predetermined cycle. Address pointer 114 sequentially outputs a "H" level voltage from the output terminals $A_0$–$A_n$ in synchronization with the rise of the reading clock signal RCK for one period of the reading clock signal RCK. Namely, as represented in FIGS. 8(b) and 8(c), when the "H" level voltage is outputted from the output terminal $A_0$ in the period from $t_1$ to $t_2$, the "H" level voltage is outputted from the output terminal $A_1$ in the subsequent period (the period from $t_2$ to $t_3$ in the drawing). Therefore, differently from the conventional one, the precharging transistor 7 is turned on together with the corresponding reading bit line access transistors 8a and 8b only when the "H" level voltage is outputted from the corresponding output terminal among the output terminals $A_0$–$A_n$ of the address pointer 114. Namely, all the reading bit lines 4 are precharged to the potential of Vcc−Vth in the cycle, with a delay of one cycle of the reading clock signal RCK from each other.

Therefore, in the period when the data is read from an arbitral memory cell 1 having the storage data of "H", through current flows only to the reading bit line 4 connected to the memory cell through the corresponding precharging transistor 7 but not to the other reading bit lines 4.

When the maximum through current flows, that is, even when the storage data of all the memory cells is at "H", the through current does not flow to all the reading bit lines 4 all the time until the end of the data reading from all the memory cells but flows only to the row selected reading bit line every time a reading bit line is selected by address pointer 114.

As the foregoing, in this serial access memory, while a time period when the through current flows to the selected reading bit line through precharging transistor 7 during the data reading corresponds to one cycle of the reading clock signal RCK, the number of reading bit lines to which the through current flows is reduced to 1/(n+1) of the conventional one, so that the total amount of the through current flowing during the data reading can be drastically reduced as compared with the conventional one. As a result, the power consumption of this serial access memory is less than that of the conventional access memory.

Furthermore, the switching of precharging transistor 7 to the off state causes the potential on the reading bit line 4 connected to this precharging transistor 7 to rapidly lower to the ground potential 0 V.

Figure 9:
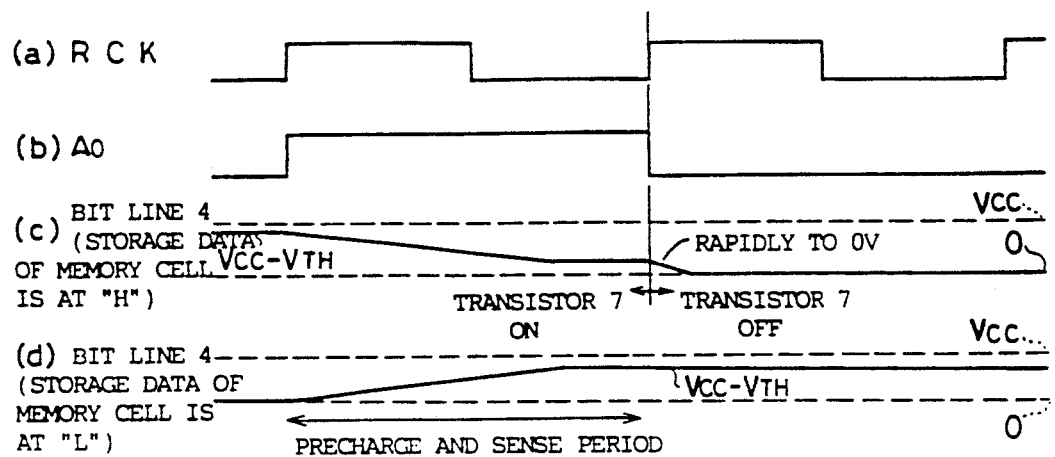
FIG. 9 is a timing chart showing a potential change of a reading bit line in the serial access memory shown in FIG. 7 during the data reading.

FIG. 9 is the timing chart showing the potential change of reading bit line 4 of this serial access memory during the data reading. FIG. 9 shows reading bit line 4 connected to the output terminal $A_0$ of address pointer 114 as a representative.

Referring to FIG. 9, it is assumed, for example, that data is read from the memory cell connected to reading bit line 4 corresponding to the output terminal $A_0$ and having the storage data of "H". In this case, when the voltage at the output terminal $A_0$ (FIG. 9(b)) rises to a "H" level in synchronization with the rise of the reading clock signal RCK (FIG. 9(a)), the potential on the reading bit line 4 is gradually reduced from the potential $Vcc-Vth$ of a "H" level to the potential ($>0$ V) of a "L" level obtained by equation (1), as shown in FIG. 9(c). Then, the potential on the reading bit line 4 is maintained at the above-described value in a period when the precharging transistor 7 corresponding to the reading bit line 4 is turned on (in a period when the voltage at the output terminal $A_0$ is at a "H" level). However, when the precharging transistor 7 is turned off, the current path between power supply line 19 for supplying the power supply potential Vcc and reading bit line 4 is cut off in the selected memory cell (see FIG. 2). As a result, the potential on the reading bit line 4 is rapidly lowered to the potential 0 V of ground 18 by storage transistor 15 and reading transistor 16 in the on state (see FIG. 2).

As the foregoing, since in this embodiment the potential on reading bit line 4 rapidly attains the original potential level ($=0$ V) corresponding to a "L" level in response to the fall of the potential level of the corresponding output terminal of address pointer 114, consequently a time required for the potential on the reading bit line 4 to attain "L" can be reduced more than by the conventional one.

As the foregoing, since the current is small which flows from the power supply to the ground through precharging transistor 7 and memory cell 1 during the data reading in this embodiment, the size of precharging transistor 7 can be made larger than that of the conventual one. The increased size, that is, the increased current drivability, of precharging transistor 7 allows the reduction in time for precharging the reading bit line 4 connected thereto to a voltage of a "H" level and a time required for the reading bit line 4 to attain a potential of a "H" level by the data reading from the memory cell. As a result, the time required for reading the data from memory cells having the storage data of "L" can be reduced.

It is assumed that the size of precharging transistor 7 is increased and the data is read from the memory cell having the storage data of "L" onto the reading bit line 4 corresponding to the output terminal $A_0$ and having a potential of a "L" level. In this case, the potential on the reading bit line 4 rises to the potential $Vcc-Vth$ of a "H" level at a speed corresponding to the size of the corresponding precharging transistor 7 in response to the rise of the potential at the output terminal $A_0$, as shown in FIG. 9(d). However, since the size of precharging transistor 7 is so large that the speed is faster than that of the conventional one (indicated by the broken line in the drawing), as shown by the solid line in FIG. 9(d).

As the foregoing, according to this serial access memory, a reduction is made in time required for setting reading bit line 4 to both a potential of a "L" level and a potential of a "H" level.

Figure 14:
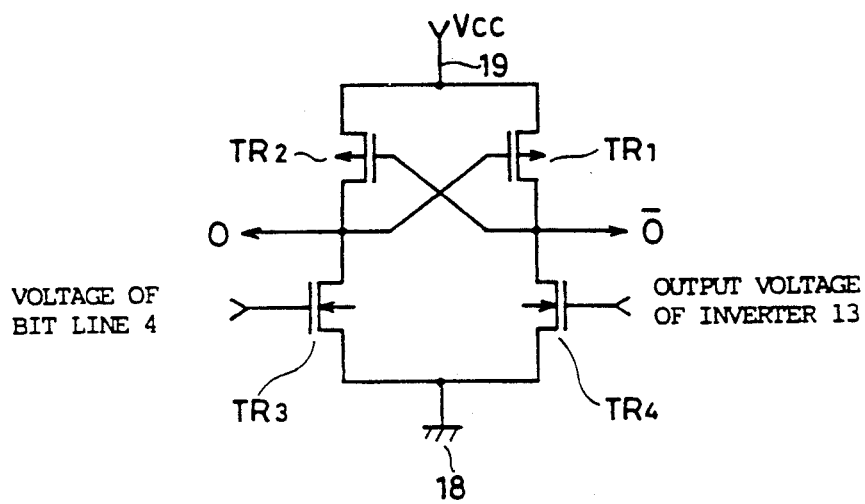
FIG. 14 is a circuit diagram showing an internal arrangement of a sense amplifier for use in the conventional serial access memory.

The arrangement and the operation of sense amplifier 102 are the same as those of the sense amplifier provided in a conventional serial access memory (see FIG. 14), wherein the voltage and the inversion of the voltage of reading bit line 4 respectively inputted through the reading bit line access transistors 8a and 8b in the on state are differentially amplified and applied to reading data buffer 104 of FIG. 1. Reading data buffer 104 also operates similarly to the conventional one. More specifically, reading data buffer 104 accepts the output signal of sense amplifier 102 in response to the rise of the reading clock signal RCK and holds the same until the subsequent rise of the reading clock signal RCK to output the same, as shown in FIG. 8(d). Therefore, each final potential level-sensed by sense amplifier 102 is sequentially outputted as the read data to data output terminal 106 in each cycle of the reading clock signal RCK.

Thus, the cycle of the reading clock signal RCK is set in consideration with the time required for the potential on the selected reading bit line 4 to attain a predetermined potential corresponding to the storage data of the selected memory cell. However, in the serial access memory, reading bit line 4 attains the predetermined potential more rapidly than the conventional one does. Thus, it is possible to set the period for precharging and level-sensing reading bit line 4, that is, the cycle of the reading clock signal RCK shorter than that in the conventional memory. Such a reduction of the cycle of the reading clock signal RCK results in the reduction in the time required for data reading in this serial access memory. Therefore, this serial access memory enables the time required for data reading to be made shorter than that in the conventional memory. Means for ellectrically connecting between each read bit line 4 and reading data buffer 104 may be a transmission gate having a CMOS structure.

While the description is given in the above-described embodiments of a case where memory cell 1 comprises three transistors and one memory capacitor, the arrangement of the memory cell is not limited thereto and it may comprise separate ports for data writing and data reading.

While in the above-described embodiments, the description is made of a case where the present invention is applied to a serial access memory wherein access is carried out in the order of addresses, the present invention can be applied to other memories such as a RAM (random access memory).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells (1) arranged in a plurality of columns,
   a plurality of reading bit lines (4) each corresponding to a respective one of said columns,
   selecting means (9) for selecting one of said reading bit lines (4) for a predetermined time period,
   precharging means (7) corresponding to each of said reading bit lines (4) for precharging said bit lines (4),
   first activating means (9) for activating the precharging means (7) corresponding to the selected bit line for a predetermined portion of said predetermined time of period,
   switching means (8) connected to said bit lines (4) for extracting the potential on said corresponding reading bit line (4), and second activating means (9) for activating said switching means (8) during said predetermined time period and subsequent to said predetermined portion.

2. A semiconductor memory device as recited in claim 1, wherein said selecting means (9) comprises means for sequentially changing the reading bit line (4) selection.

3. A semiconductor memory device as recited in claim 1, wherein said selecting means (9) comprises shift register means (F0-Fn) and logic circuit means (G0-Gn, NR0-NRn) for generating signals to activate said first and second activating means (9).

4. The semiconductor memory device as recited in claim 3, wherein said selecting means (9) comprises:
first signal applying means (F0-Fn, G0-Gn) for applying first signals for designating said predetermined portion,
second signal applying means (F0-Fn, NR0-NRn) for applying second signals for designating a portion subsequent to said predetermined portion and during said predetermined time period,
said first activating means (9) shares said first signal applying means (F0-Fn, G0-Gn) with said selecting means (9),
said second activating means (9) shares said second signal applying means (F0-Fn, NR0-NRn) with said selecting means (9).

5. The semiconductor memory device as recited in claim 4, wherein said selecting means (9) sequentially selects one of said reading bit lines (4) for every said predetermined time period.

6. The semiconductor memory device as recited in claim 5, wherein said first signal applying means (F0-Fn, G0-Gn) sequentially applies said first signal to one of said precharging means (7) for every said predetermined time period,
said second signal applying means (F0-Fn, NR0-NRn) sequentially applies said second signal to one of said switching means (8) for every said predetermined time period at a timing delayed from said first signal applying means by a time period corresponding to said portion.

7. A semiconductor memory device as recited in claim 1, wherein said precharging means (7) comprises a semiconductor switching device (7) connected between each reading bit line (4) and a power supply (Vcc).

8. The semiconductor memory device as recited in claim 7, wherein a polarity of said semiconductor switching device (7) is N type.

9. The semiconductor memory device as recited in claim 4, wherein each of said switching means (8) includes a semiconductor switching device (8) having a first conduction terminal connected to the corresponding reading bit line (4), a second conduction terminal and a control terminal for receiving said second signal.

10. The semiconductor memory device as recited in claim 9, wherein the polarity of said semiconductor switching device (8) is N type.

11. The semiconductor memory device as recited in claim 4, wherein the logical level of said first signal and the logical level of said second signal are the same.

12. The semiconductor memory device as recited in claim 5, wherein
said shift register means includes the same number of flip-flop means (F0-Fn),
each of said flip-flop means (F0-Fn) being controlled by an external clock signal to apply first and second output signals having logical levels complementary from each other,
said logic circuit means (NR0-NRn, G0-Gn) comprises first logic gate means (G0-Gn) provided corresponding to said respective flip-flops (F0-Fn) and second logic gate means (NR0-NRn) provided corresponding to said respective flip-flop means (F0-Fn),
each of said first logic gate means (G0-Gn) receiving said first output signal of the corresponding one of said flip-flop means (F0-Fn) and said external clock signal to output said first signal,
each of said second logic gate means (NR0-NRn) receiving said second output signal of the corresponding one of said flip-flop means (F0-Fn) and said external clock signal to output said second signal,
said first signal applying means (F0-Fn, G0-Gn) includes said flip-flop means (F0-Fn) and said first logic gate means (G0-Gn),
said second signal applying means (F0-Fn, NR0-NRn) includes said flip-flop means (F0-Fn) and said second logic gate means.

13. The semiconductor memory device as recited in claim 12, wherein said first logic gate means (G0-Gn) includes two-input AND gates (G0-Gn) and said second logic gate means (NR0-NRn) includes two-input NOR gates (NR0-NRn).

14. A semiconductor memory device comprising:
a plurality of memory cells (1) arranged in a plurality of columns,
a plurality of reading bit lines (4) each corresponding to said respective one of said columns,
selecting means (114) for selecting one of said reading bit lines for a predetermined period,
precharging means (7) corresponding to each of said reading bit lines (4) for precharging said corresponding reading bit lines, and
activating means (114) for activating one of said precharging means (7) corresponding to the selected reading bit line for only said predetermined period.

15. The semiconductor memory device as recited in claim 14, wherein said selecting means (114) sequentially selects one of said reading bit lines.

16. The semiconductor memory device as recited in claim 14, wherein said selecting means (114) and said activating means (114) commonly comprise signal applying means (114) for applying a signal for designating said predetermined period and selectively one of said reading bit lines (4).

17. The semiconductor memory device as recited in claim 14, wherein said selecting means (114) sequentially selects one of said reading bit lines (4).

18. The semiconductor memory device as recited in claim 16, wherein said signal applying means (114) sequentially applies said designating signal to one of said precharging means (7).

19. A semiconductor memory devices as recited in claim 14, wherein said selecting means (114) comprises shift register means (F0-Fn) and logic circuit means (G0 -Gn).

20. The semiconductor memory device as recited in claim 16, wherein each of said precharging means (7) includes a semiconductor switching means (7) having a control terminal for receiving said designating signal, a first conduction terminal connected to the corresponding reading bit line (4) and a second conduction terminal connected to a power supply (19).

21. The semiconductor memory device as recited in claim 20, wherein the polarity of said semiconductor switching means (7) is N type and the logical level of said designating signal is a "H" level.

22. The semiconductor memory device as recited in claim 18, wherein
said shift register mean includes flip-flop means (F0–Fn) of the same number as that of said columns which are connected in series,
said logic circuit means includes logic gate means (G0–Gn) provided corresponding to said respective flip-flop means (F0–Fn),
each of said logic gate means (G0–Gn) receiving the output of the corresponding one of flip-flop means (F0–Fn) and an external clock signal to output said designating signal,
said signal applying means (114) includes said flip-flop means (F0–Fn) and said logic gate means (G0–Gn).

23. The semiconductor memory device as recited in claim 22, wherein said logic gate means (G0–Gn) include two-input AND gates (G0–Gn).

24. A serial access semiconductor memory device comprising:
a plurality of memory cells (1) arranged in a matrix of rows and columns,
a writing word line (5) corresponding to each row of memory cells (1) and a writing bit line (3) corresponding to each column of memory cells (1) for selectively writing information to said memory cells (1);
a reading word line (6) corresponding to each row of memory cells (1) and a reading bit line (4) corresponding to each column of memory cells (1) for selectively reading information from said memory cells (1),
each memory cell (1) comprising a writing transistor (14), a storage capacitor (17), a storage transistor (15) and a reading transistor (16),
selecting means (9) for sequentially selecting one of said reading bit lines (4) for a predetermined time period,
precharging means (7) corresponding to each of said reading bit lines (4) for precharging said bit lines (4),
first activating means (9) for activating the precharging means (7) corresponding to the selected bit line for a predetermined portion of said predetermined time period,
switching means (8) connected to said bit lines (4) for extracting the potential on said corresponding reading bit line (4), and
second activating means (9) for activating said switching means (8) during said predetermined time period and subsequent to said predetermined portion.

25. A semiconductor memory device as recited in claim 24, wherein said switching means (8) comprises transistor means directly connected to each reading bit line (4), and further comprising reading data buffer means (104) directly connected to said switching means (8) for reading information from a selected bit line.

26. A serial access semiconductor memory device comprising:
a plurality of memory cells (1) arranged in a matrix of rows ad columns;
a writing word line (5) corresponding to each row of memory cells (1) and a writing bit line (3) corresponding to each column of memory cells (1) for selectively writing information to said memory cells (1);
a reading word line (6) corresponding to each row of memory cells (1) and a reading bit line (4) corresponding to each column of memory cells (1) for selectively reading information from said memory cells (1),
each memory cell (1) comprising a writing transistor (14), a storage capacitor (17), a storage transistor (15) and a reading transistor (16),
selecting means (114) for sequentially selecting one of said reading bit lines (4) for a predetermined period,
precharging means (7) corresponding to each of said reading bit lines (4) for precharging said corresponding reading bit lines (4) to a predetermined potential, and
activating means (114) for activating one of said precharging means (7) corresponding to the selected read bit line only for said predetermined period.

27. The semiconductor memory device as recited in claim 24, wherein each of said plurality of memory cells (1) comprises:
a first field effect semiconductor element (14) connected to the corresponding one of said writing bit lines (3) and the corresponding one of said writing word lines (5),
a second field effect semiconductor element (16) connected to the corresponding one of said reading bit lines (4) and the corresponding one of said reading word lines (6),
a third field effect semiconductor element (15) provided between said first field effect semiconductor element (14) and said second field effect semiconductor element (16),
a capacitance element (17) provided between said first field effect semiconductor element (14) and said third field effect semiconductor element (15).

28. The semiconductor memory device as recited in claim 26, wherein each of said plurality of memory cells (1) comprises:
a first field effect semiconductor element (14) connected to the corresponding one of said writing bit lines (3) and the corresponding one of said writing word lines (5),
a second field effect semiconductor element (16) connected to the corresponding one of said reading bit lines (4) and the corresponding one of said reading word lines (6),
a third field effect semiconductor element (15) provided between said first field effect semiconductor element (14) and said second field effect semiconductor element (16),
a capacitance element (17) provided between said first field effect semiconductor element (14) and said third field effect semiconductor element (15).

29. A semiconductor memory device comprising:
a plurality of memory cells (1) arranged in a plurality of columns,
reading bit lines (4) provided corresponding to said plurality of columns,
selecting means (9,114) for selecting one said reading bit lines (4), and
precharging means (7) provided corresponding to said respective reading bit lines (4) for precharging, only for a predetermined period, a corresponding reading bit line (4) to a predetermined potential when said corresponding reading bit line (4) is selected by said selecting means (9, 114).

30. The semiconductor memory device as recited in claim 4, wherein each of said switching means includes a first semiconductor switching element and a second semiconductor switching element, said first and second semiconductor elements connected in parallel to each other and having complementary polarities.

* * * * *